United States Patent [19]

Chai

[11] B  3,982,274

[45] Sept. 21, 1976

[54] COLOR CODING FILTER FOR CHARGE-COUPLED-DEVICE CAMERA

[75] Inventor: Sooyoung Chai, Madison Township, Middlesex County, N.J.

[73] Assignee: Bell Telephone Laboratories, Incorporated, Murray Hill, N.J.

[22] Filed: Sept. 3, 1974

[21] Appl. No.: 502,289

[44] Published under the second Trial Voluntary Protest Program on January 13, 1976 as document No. B 502,289.

[52] U.S. Cl. ................................. 358/41; 178/7.1
[51] Int. Cl.² .................... H04N 9/04; H04N 3/16
[58] Field of Search .............. 358/43, 41, 44, 55, 358/48, 12, 14, 5; 178/7.86, 7.1; 307/221 D; 357/24; 350/162 SF

[56] References Cited
UNITED STATES PATENTS

| | | | |
|---|---|---|---|
| 3,647,948 | 3/1972 | Eto et al. | 358/5 |
| 3,801,884 | 4/1974 | Sequin | 307/221 |
| 3,811,055 | 6/1974 | Weimer | 357/24 |

*Primary Examiner*—Benedict V. Safourek
*Assistant Examiner*—R. John Godfrey
*Attorney, Agent, or Firm*—David L. Hurewitz; Bryan W. Sheffield

[57] ABSTRACT

A color coding filter is combined with a single area-imaging charge-coupled-device (CCD) to form a color television camera. Three-phase CCD of frame transfer type provides a 2:1 interlace scanning format, and the color filter is designed for compatibility with this format. The filter is formed from a plurality of different color transmissivity areas arranged in a specific grid-like pattern to provide the distinct filter characteristics required for each of the two interlaced fields. With this filtering, the CCD generates a continuous luminance and two line-sequential chrominance (color difference) signals.

21 Claims, 4 Drawing Figures

COLOR CODING FILTER FOR CHARGE-COUPLED-DEVICE CAMERA

BACKGROUND OF THE INVENTION

This invention relates to solid-state color imaging devices and, more particularly, to a passive color coding filter for use with a charge-coupled imaging device.

As is well known, transmission of a color representation of a scene requires three independent video signals. These signals must be registered to produce an acceptable reconstructed image and a color television camera using only a single imaging device assures this registration. A camera having only one imaging device is, of course, also preferred over multiple imaging devices for obvious economic reasons.

One common format of the three independent video output signals includes two line-sequential chrominance (color difference) signals and a continuous luminance signal; that is, in each alternating horizontal scan line a different color difference signal is produced while all scan lines produce the luminance signal. Furthermore, it is desirable to operate with the conventional 2:1 line interlace in the vertical direction. While these characteristics can be provided by sampling each of a number of points in an imaging area and then electrically processing or matrixing the resulting outputs, it is by far more efficient to use optical filtering which permits the imaging device to produce the desired electrical signals directly, without matrixing.

When a single imaging device is used the color information is generated by a color coding filter which is placed between the scene and the device. While color coding filters having three-color stripe sets have been used extensively with electron beam scanning cameras, a new solid-state imaging structure, referred to herein as a charge-coupled-device or CCD, has been developed and the prior striped filter arrangements are not necessarily compatible with the CCD operation.

The charge-coupled-device concept is now well known, having been described extensively in the technical literature and prior patents. In particular, U.S. Pat. No. 3,801,884 issued Apr. 2, 1974 to C. H. Sequin, describes various charge transfer arrangements in area-imaging charge-coupled-devices. FIG. 5 of that patent illustrates a three-phase-transfer scheme which provides a 2:1 line interlace scanning format. In essence, two spatially overlapping cell patterns are formed, and one pattern of resolution cells produces a signal in one field and the other pattern of resolution cells produces a signal in the second field.

Since the color coding filters designed for the beam scanning devices are not generally suitable for the area-imaging charge-coupled-devices, and are particularly inappropriate for use with the three-phase transfer device providing the 2:1 interlace, it is an object of the present invention to provide a passive filter suitable for color coding the light impinging upon an area-imaging charge-coupled-device having a line interlace scanning format. In particular, it is an object of the present invention to provide a color coding filter suitable for use with a three-phase area-imaging charge-coupled-device having a 2:1 line interlace scan.

It is a further object of the present invention to provide line sequential color difference signals and a continuous luminance signal directly from the output of an area-imaging charge-coupled device without the need for matrixing or signal processing.

SUMMARY OF THE INVENTION

In accordance with the present invention a three-phase frame transfer area-imaging charge-coupled-device is combined with a color coding filter to form a color television camera. The filter samples the light from a scene and enables a single CCD to produce both the luminance and two line sequential color difference signals. The CCD forms an array of charge accumulations in accordance with the light impinging upon its image sensing surface. It operates to integrate the light falling within defined boundaries, referred to herein as resolution cells, and locates a charge accumulation at or near the center of each cell. These charge accumulations are then read out in sequence of discrete signal components, the charge accumulations of each horizontal row of cells producing one scan line of a video signal.

The CCD operates in a 2:1 line interlace mode and the filter is arranged so that it provides the distinct but interrelated filter characteristics required for each of the two interlaced fields. In successive fields the locations of charge accumulations, and hence the corresponding resolution cells, are displaced in a vertical direction, but the entire image sensing surface is used in each field.

The color coding filter must provide a specific color transmissivity for each cell in the image sensing surface, and as the cell pattern is different in successive fields, the filter must yield different color filter patterns. This is accomplished by an inert filter design based upon a grid-like pattern of zones, each zone corresponding to a cell in the CCD. The filter is located so that light impinging upon a cell passes exclusively through its corresponding zone. A zone is, in turn, formed from two separate filter areas, each having its own color transmissivity characteristic. However, each of the two areas associated with a specific cell in one field are combined with another area to form a different filter zone in the succeeding field.

A preferred filter design, in accordance with the invention, is compatible with the 2:1 line interlace and also generates a luminance and two line-sequential color difference signals without matrixing. It requires a specific arrangement of the color filter areas, and this filter design may be structurally embodied by utilizing primary color filter material as subareas of each filter area and selecting the relative sizes of the subareas to yield the desired transmissivity characteristic for the area as a whole.

BRIEF DESCRIPTION OF THE DRAWING

FIG. 3 is a schematic diagram of the signal processing circuit in the camera of FIG. 1.

DETAILED DESCRIPTION

Figure 1:
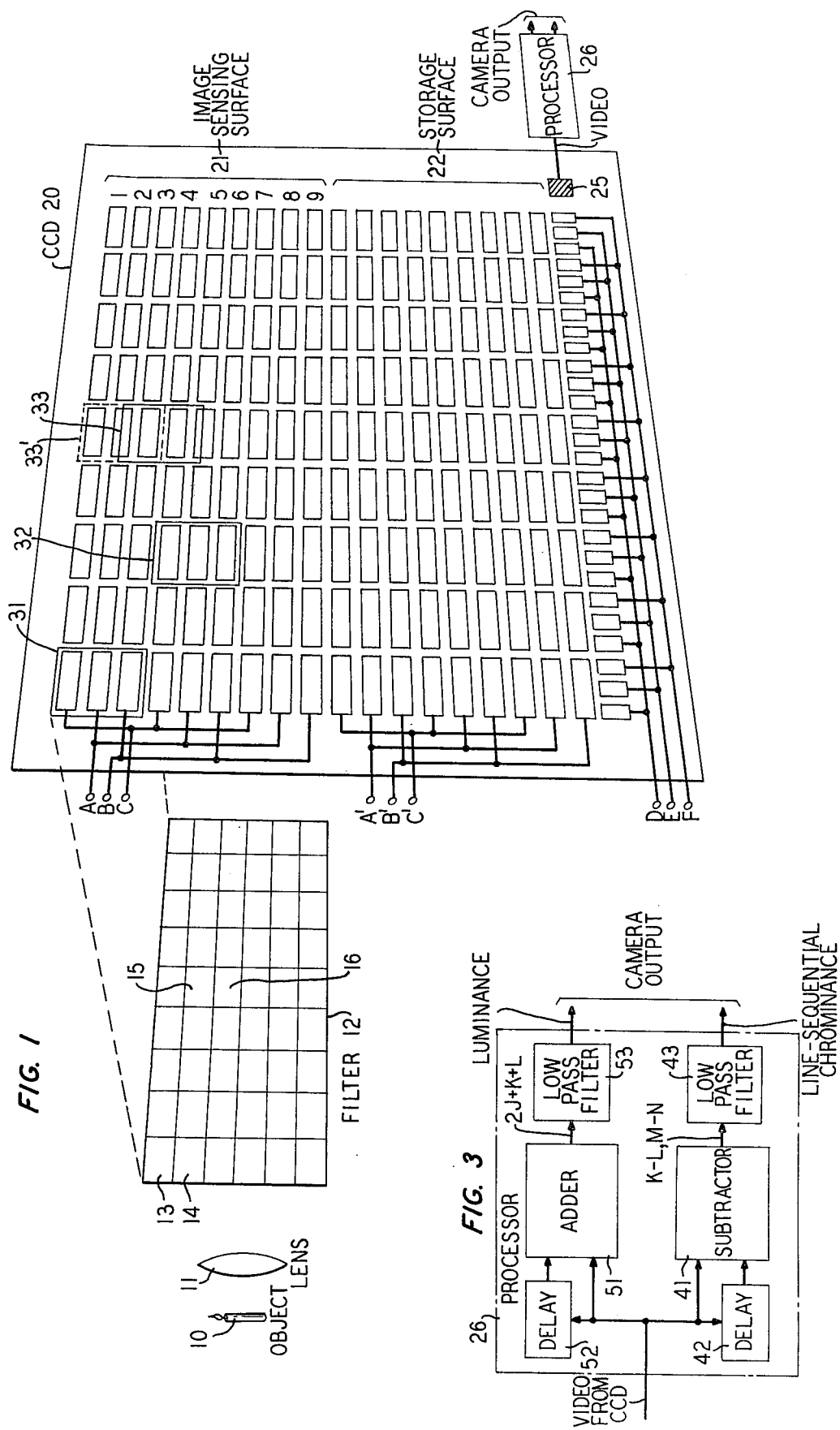
FIG. 1 is a prospective view of a color television camera including a color coding filter and an area-imaging charge-coupled-device in accordance with the present invention.

FIG. 1 shows a television camera in which a color representation of object 10 is produced. Imaging lens 11 focuses the light from object 10 onto the image-sensing surface 21 of area-imaging charge-coupled-device 20. All light impinging upon surface 21 passes through color coding filter 12 which is attached directly to the CCD surface.

CCD 20 is of the three-phase frame transfer type described in the aforementioned Sequin patent, and in general in an article entitled "Charge-Coupling Technology Leads to Compact Video Cameras" by H. A. Watson, *Bell Laboratories Record*, October 1973, page 266. It is a single semiconductive chip (for example, silicon) with electrodes appropriately positioned in horizontal rows and vertical columns. The circuit side of the CCD is shown having an array of 9 by 9 electrodes in the image-sensing surface 21. It is, of course, obvious that any number of electrodes may be shown and this array size is merely illustrative.

The electrodes in each row are electrically connected and, as described in the Sequin patent and the Watson article, reverse bias voltages are applied to bias terminals A, B and C. The impinging light is converted into proportional electrical charge behind (in the semiconductor) the electrodes and the specific bias causes the charge to be accumulated in potential wells located behind the single rectilinear resolution cell from which the charge is accumulated.

The charge pattern for each cell in the entire image-sensing area is conventionally formed in approximately one-sixtieth of a second. Then the sequential application of reverse bias voltages to bias terminals A, B and C causes the accumulated charges to move row-by-row into the storage surface 22. This is conventionally accomplished in the vertical blanking period of approximately one millisecond. Normally, in the first field, the electrodes connected to bias terminal A receive the greatest reverse bias so that the charge accumulates behind the electrodes in every third row, that is, 2, 5 and 8. Then, in the second field the greatest reverse bias is applied simultaneously to bias terminals B and C so that the charge accumulates under the electrodes connected to these terminals. The effect of this biasing is essentially to create potential wells centered behind the space between the rows connected to terminals B and C, that is, for example, between rows 3 and 4, and between rows 6 and 7. The details of the charge accumulation at the upper and lower boundaries of the image sensing surface 21 are irrelevant to the present invention and are therefore ignored.

The charge transfer to the storage surface 22 is accomplished in the same manner for both fields and it simply produces in surface 22 a duplicate of the charge pattern previously formed in the image sensing surface 21. The charge patterns are in storage only while the pattern in the next field is being formed; in this one-sixtieth of a second the stored charges are read out, row-by-row, by applying appropriate bias to the electrodes A', B' and C' and D, E and F. By sequentially biasing the electrode rows connected to terminals A', B' and C' the charge associated with each row is dumped into a serial read-out register formed by the electrodes connected to terminals D, E and F. A sequential application of bias to terminals D, E and F moves the charge pattern in the register to the output. The charges derived from a horizontal row of electrodes in the image sensing surface will be dumped to output diode 25 as a unit. This produces a sequence of discrete signal components, which is video signal of that one "scan" line. Accordingly, from a picture format point-of-view each group of three electrode rows produces a scan line, and three adjacent electrodes in each vertical column define a rectilinear resolution cell.

Every electrode in the image sensing surface 21 is part of one cell during each field. As shown, the 81 electrodes of surface 21 form an array of 3 by 9 resolution cells. Exemplary cells are shown as 31, 32 and 33. Cells 31 and 32 are defined for the first field; that is, when the charge is accumulated under the rows connected to bias terminal A. In the second field the resolution cells are centered over the space separating the rows connected to terminals B and C. Cell 33 is defined for the second field.

As can be seen for a 2:1 line interlace the cell pattern in the two fields are displaced vertically, the horizontal boundaries of a cell in one field being midway between the boundaries of the cells in the other field. Thus, the horizontal boundary in cell 33 is seen to cut through electrodes in rows 2 and 5. The vertical boundaries of the cells lie between the electrode columns and are the same for both fields.

It is pointed out that the boundaries of the resolution cells are presented for purposes of explanation only and that no actual structure corresponds to these lines. However, the charge centered behind each cell is the integrated effect of all of the light impinging upon the image-sensing surface within the cell boundary.

The filter 12 passes light to the image-sensing surface 21. Its structure will be described in detail below, but for general explanation it is divided into areas forming the grid pattern shown. The filter is mounted on the CCD 20 and registered with image-sensing surface 21 so that each area, such as 13, 14, 15 and 16, corresponds to a specific one-half of a resolution cell in the image-sensing surface 21. Hence, for example, in a first field all light impinging on resolution cell 31 will pass exclusively through filter areas 13 and 14. In a second field all light impinging on zone 33 will pass exclusively through filter areas 15 and 16. Of course, the light passing through filter area 15 will illuminate only the top half of the second field cell 33, and the light passing through filter area 16 will illuminate only the bottom half of cell 33. In the first field the light passing through filter area 15 will illuminate the same geometric area of image-sensing surface 21, but in this case will impinge on the lower half of an overlapping resolution cell shown dotted as 33'.

Each pair of areas in the filter 12 will be referred to as a zone corresponding to its particular resolution cell, and as the cell boundaries are redefined in successive fields, so are the zone boundaries in the filter 12. It is important to remember, however, that the filter structure is passive, or structurally inert. It does not actually differ during the two fields; the zones are merely redefined to aid in explanation.

The make-up of the filter 12 will determine the color characteristics of the light impinging upon the resolution cells of the image-sensing surface 21. Hence, the filter's transmissivity characteristics will determine the characteristics of the video signal produced by output diode 25. These signals are applied to processing circuit 26 which, as will be discussed below, produces the requisite luminance and chrominance signals which are the camera output.

Figure 2:
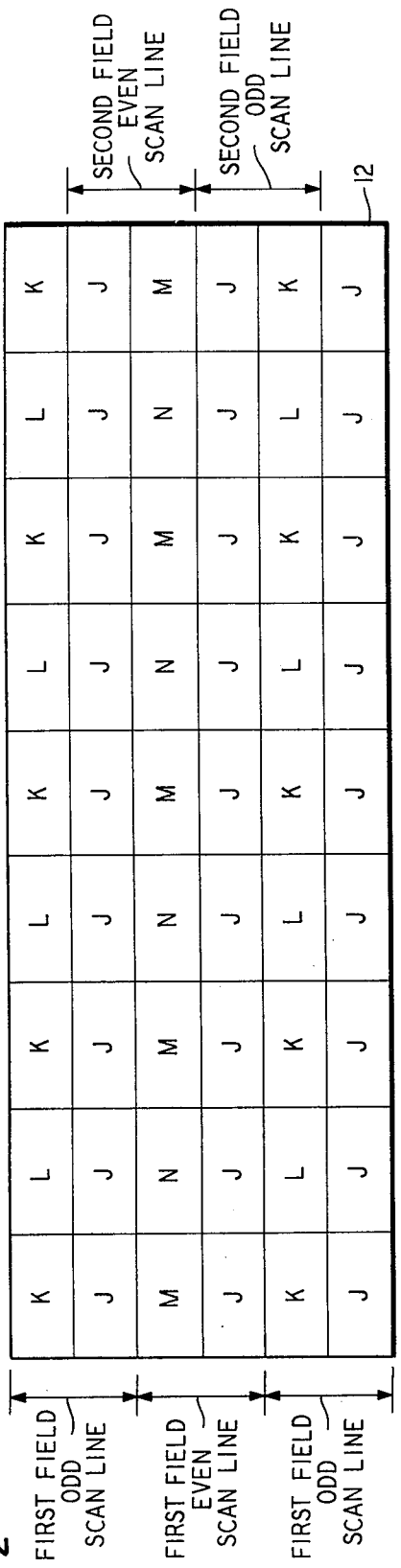
FIG. 2 is a diagrammatic representation of a color coding filter in accordance with the present invention for use in the camera of FIG. 1.

FIG. 2 illustrates the structure of filter 12. As can be seen it is formed in a repetitive grid-pattern of areas, each exhibiting one of five color transmissivity characteristics designated J, K, L, M and N. Every two vertically adjacent areas constitute a zone, and the repetitive grid-pattern of zones exhibits four different color transmissivity characteristics K + J, L + J, M + J and N + J.

The filter 12 samples the light from the scene in both the horizontal and vertical directions and is arranged to produce two different sets of colors, each on a line-sequential basis, in each field. In the first field, the zone consisting of areas 13 and 14 passes light to the CCD resolution cell 31 in FIG. 1. This light may be designated K + J. The next cell along this odd horizontal scan line in the first field will receive light designated L + J. As can be seen from FIG. 2, K + J alternates horizontally with L + J in each odd scan line in this field and M + J alternates horizontally with N + J in the even scan lines.

While the scan lines of the second field are displaced vertically by half a zone so that, for instance, the light impinging upon cell 33 in the second field will pass through areas 15 and 16, the same line-sequential pattern is produced in the second field as in the first. The filter alternately passes K + J and L + J in odd scan lines and M + J and N + J in the even scan lines of the second field. Thus, with filter 12 sampling the light impinging upon imaging-area CCD 20, line-sequential signals of the format:

$$K + J, L + J, K + J, L + J, \ldots \quad (1)$$

and $$M + J, N + J, M + J, N + J, \ldots \quad (2)$$

are generated by CCD 20 in both fields, where each sum consists of a sequence of two alternating discrete components, such as K + J and L + J.

Processing these signals is accomplished in signal processor 26 shown in FIG. 3. This circuit recovers and delays the signals to produce line-sequential color difference signals K − L and M − N from alternating scan lines in each field. It also produces a luminance signal from each line in both fields.

In particular, the line sequential signals are applied to a subtraction circuit which includes subtractor 41 and delay circuit 42. The delay time of circuit 42 is one horizontal sampling time or the time between the discrete components of a scan line. Thus, subtractor 41 produces a signal representative of the difference between the light passing through two horizontally adjacent zones of filter 12. Accordingly, (K + J) − (L + J) is produced during odd scan lines and (M + J) − (N + J) is produced during even scan lines. The resultant two line-sequential color difference signals K − L and M − N are passed through lowpass filter 43, which removes the high frequency ripple, and the output of filter 43 is the line-sequential chrominance signal of the camera output.

Simultaneously, the line-sequential signals are applied to an adding circuit which includes adder 51 and delay circuit 52. Circuit 52 also delays the signals by one horizontal sampling time so that adder 51 essentially combines the light passing through two horizontally adjacent zones of filter 12, hence, producing in odd lines K + J + L + J or 2J + K + L, and in even scan lines M + J + N + J or 2J + M + N.

In order to generate the proper luminance signal the transmissivities of the filter areas must be related so that $$K + L = M + N \quad (3)$$

If this property is satisfied, $$2J + K + L = 2J + M + N \quad (4)$$

and a continuous luminance signal is obtained from every scan line. This signal is passed through lowpass filter 53 to remove high frequency ripple, and the filtered output is the luminance signal of the camera output.

Several choices for the transmissivity characteristics, J, K, L, M and N, of the color filter areas will satisfy equation (3). For example, one may simply use the primary colors, letting K = red, L = blue, M = red + blue, N = black and G = green. This technique will result in a luminance signal 2G + R + B and line-sequential color signals of R − B and R + B, where G is total green, R is total red and B is total blue.

While it is theoretically possible to manufacture a single filter material having any required color characteristic, such as magenta which is red + blue, it is from a practical standpoint often exceedingly difficult to produce the specific characteristic which is desired. It may therefore be preferred to simply subdivide each area into subareas and adjacently position different filter materials in the subareas. In this manner the sizes and characteristics of the adjacently positioned materials determine the effective transmissivity characteristic of the area. A physical arrangement, shown in FIG. 4, utilizes only three filter materials, providing respectively total transmissivity of red, green and blue light, to produce the five individual characteristics J, K, L, M and N for the filter areas.

Figure 4:
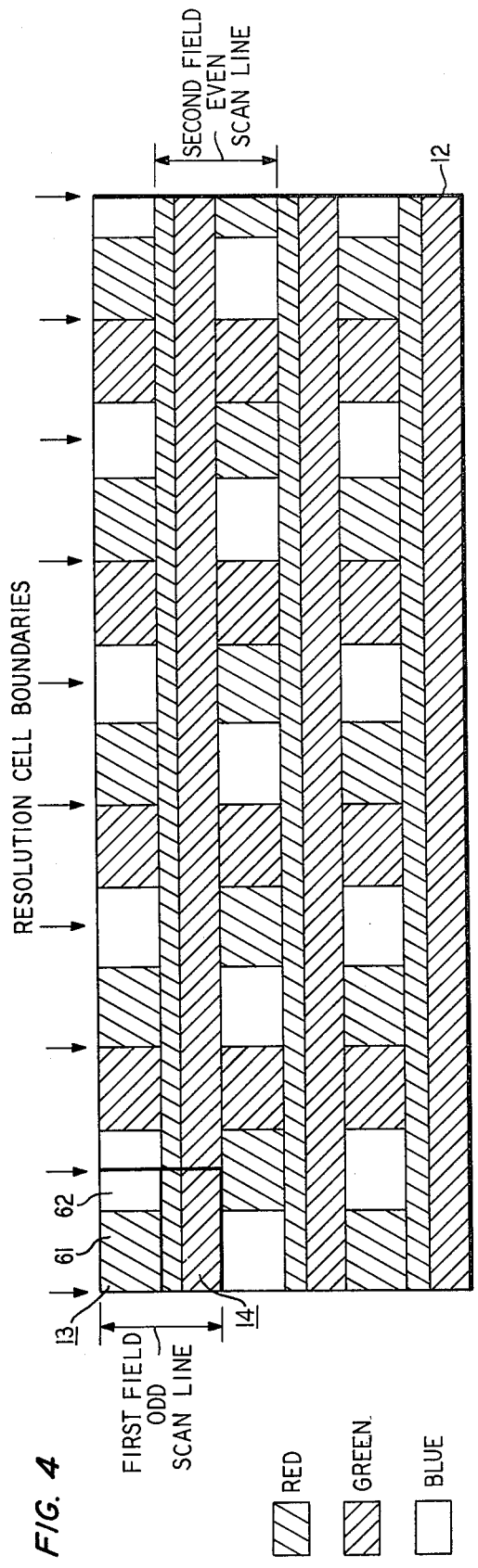
FIG. 4 illustrates one embodiment of a color coding filter in accordance with the present invention for use in the camera of FIG. 1.

It is well known that placing different filter characteristics adjacent one another within a defined boundary yields the composite color filter proportional to the weighted sum of the filter characteristics. Accordingly, for example, in area 13 of filter of FIG. 4 two-thirds of the area is filled with the material 61 passing only red light and one-third of the area contained material 62 passing only blue light, the combined result of light passing through area 13 is two-thirds red plus one-third blue, which may be defined as K. Similarly, area 14 consists of a one-third subarea passing red light and a two-thirds subarea passing green light. The specific geometric arrangement of filter materials within any particular area is, of course, arbitrary from an electrical point-of-view, but the pattern shown in FIG. 4 is preferred for simplicity of filter fabrication.

The characteristics of all of the filter areas of FIG. 4 can be expressed as follows:

$$\begin{aligned} J &= \tfrac{2}{3}G + \tfrac{1}{3}R \\ K &= \tfrac{2}{3}R + \tfrac{1}{3}B \\ L &= \tfrac{2}{3}G + \tfrac{1}{3}B \\ M &= \tfrac{2}{3}B + \tfrac{1}{3}R \\ N &= \tfrac{2}{3}G + \tfrac{1}{3}R \end{aligned} \quad (5)$$

This arrangement can be seen to satisfy the necessary condition that K + L = M + N and the addition in processor 26 yields a luminance signal $$2J + K + L = \tfrac{2}{3}(3G + 2R + B) \quad (6)$$

The subtraction process results in the line-sequential signals of $$K - L = \tfrac{2}{3}(R - G) \quad (7)$$

and $$M - N = \tfrac{2}{3}(B - G). \tag{8}$$

Using the filter design of FIG. 4 the normalized signals generated by processor 26 will be luminance Y:

$$Y = \tfrac{1}{3}R + \tfrac{1}{2}G + \tfrac{1}{6}B \tag{9}$$

and chrominance signals I and Q;

$$I = R - G \tag{10}$$

and $$Q = B - G. \tag{11}$$

The red, green and blue signals for receiver display can be obtained by the following combinations:

$$R = \tfrac{2}{3}I - \tfrac{1}{6}Q + Y, \tag{12}$$

$$G = \tfrac{1}{3}I - \tfrac{1}{6}Q + Y \tag{13}$$

$$B = \tfrac{1}{3}I + \tfrac{5}{6}Q + Y. \tag{14}$$

In all cases it is to be understood that the above-described arrangements are merely illustrative of a small number of the many possible applications of the principles of the present invention. Numerous and varied other arrangements in accordance with these principles may readily be devised by those skilled in the art without departing from the spirit and scope of the invention.

What is claimed is:

1. A color coding filter for use with an imaging device for converting light into electrical signals using a multiple-field format, the imaging device having a sensing surface being divided into an array of rectilinear resolution cells distinctive for each field, the cells defining a grid-pattern in each field and the cell boundaries in successive fields being displaced in at least one dimension to form overlapping grid patterns in the successive fields, the filter comprising a plurality of rectilinear zones which are arranged in direct correspondence to the cell array of the sensing surface so that all light from a scene impinging on any cell of the sensing surface passes through a corresponding zone in the filter, a plurality of discrete color areas being contained within each filter zone and being arranged so that the zone boundaries may be redefined with the change of cell boundaries during successive fields, the transmissivity characteristic of each color filter area being selected to produce a desired color coding for each zone.

2. A filter as claimed in claim 1 wherein the color transmissivity characteristic of each zone is determined by the sum of the color transmissivities of the color filter areas within its boundaries, the areas being arranged to produce a repetitive pattern of zones having different effective color transmissivity characteristics.

3. A filter as claimed in claim 2 wherein the filter areas are arranged to produce during successive fields different repetitive patterns of zones having different effective color transmissivity characteristics.

4. A filter as claimed in claim 1 wherein the number of filter areas in each zone is equal to the number of fields and each area includes a combination of adjacently located subareas formed of materials of different transmissivities, the effective color transmissivity of an area being the sum of the color transmissivities of the individual materials weighted in accordance with the size of the subareas.

5. A filter as claimed in claim 1 wherein the interlace format includes two fields, and the zone boundaries in one field include a first set of parallel equally spaced lines in one direction and a second set of parallel equally spaced lines in an orthogonal direction, and the zone boundaries in the successive field include parallel equally spaced lines located midway between the parallel lines of the first set of lines in the first field.

6. A filter as claimed in claim 5 wherein the boundaries in the successive field include the same parallel equally spaced lines of the second set of lines in the first field.

7. A filter as claimed in claim 1 wherein the interlace format includes two fields and in the first field each zone has one of four effective color transmissivity characteristics, the characteristics alternating in pairs in two orthogonal directions.

8. A filter as claimed in claim 7 wherein the horizontally displaced cells in the imaging device constitute a scan line and the imaging device produces for each cell in each scan line an electrical indication of the color transmissivity characteristics of its corresponding zone, the sum of the indications from any two adjacent cells in a scan line producing a luminance signal and the difference between these indications from two adjacent cells in the scan line producing a color difference signal, the filter being arranged so that successive scan lines produce two different color difference signals on sequential lines and the same two line-sequential color difference signals are produced in both fields, the luminance signal being the same for all scan lines in both fields.

9. A filter as claimed in claim 1 wherein the filter areas each have any one of five effective color transmissivity characteristics, J, K, L, M, N, the characteristics being selected so that
$$K + L = M + N$$
and $K + L + 2J$ yields a luminance signal.

10. A filter as claimed in claim 9, wherein $$J = \tfrac{2}{3}G + \tfrac{1}{3}R$$

$$K = \tfrac{2}{3}R + \tfrac{1}{3}B$$

$$L = \tfrac{2}{3}G + \tfrac{1}{3}B$$

$$M = \tfrac{2}{3}B + \tfrac{1}{3}R$$

$$N = \tfrac{2}{3}G + \tfrac{1}{3}R$$

where G is total transmissivity of green light, B is total transmissivity of blue light, and R is total transmissivity of red light.

11. A color television camera system for producing signals representative of the color content of a scene comprising:

an area-imaging charge-coupled-device having an array of electrodes arranged in a pattern of rectilinear resolution cells, the device producing a charge accumulation proportional to the light impinging upon each resolution cell, the device including means for converting the plurality of charge accumulations into video signals, the video signals being produced in two fields, the signal in the first field being representative of a first cell pattern and the signal in the second field being representative of a second cell pattern, the first and second cell patterns overlapping spatially, a color coding filter having color filter areas arranged in rectilinear zones, each zone formed from a combination of filter areas arranged so that a first-field zone corresponds to every cell in the first field, the filter areas being arranged so that different combinations of filter areas also form a second-field zone corresponding to every cell in the second field, the filter being positioned so that all light impinging upon every cell in the first and second fields passes exclusively through a corresponding first and second field zone, respectively.

12. A color television camera system as claimed in claim 11 wherein the charge-coupled-device operates in a three-phase frame transfer mode to produce the video signals in the two fields in a 2:1 line interlace format.

13. A color television camera system as claimed in claim 11 wherein each rectilinear zone is formed from a combination of two filter areas and the two areas in a zone in one field are each combined with another area to form a different rectilinear zone in the second field.

14. A color television camera system as claimed in claim 11 wherein the video signals constitute scan lines consisting of sequences of discrete components representative of the charge accumulations associated with horizontally adjacent resolution cells, and wherein the filter is arranged so that successive scan lines produce two different color difference signals and the same two line-sequential color difference signals are produced in both fields, so that the same luminance signal is produced for all scan lines in both fields.

15. A color television camera system as claimed in claim 14 further comprises means for processing the video signals, said processing means including means for subtracting in each scan line the discrete components derived from each two horizontally adjacent resolution cells to form line-sequential color difference signals and means for adding in each scan line the discrete components derived from each two horizontally adjacent resolution cells to form a luminance signal.

16. A color television camera system as claimed in claim 11 wherein each filter area includes a combination of adjacently located subareas formed of materials of different transmissivities, the effective color transmissivity of the area being the sum of the color transmissivities of the individual materials weighted in accordance with the size of the subareas.

17. A color television camera system as claimed in claim 11 wherein the color coding filter is arranged so that the zone boundaries in one field include a first set of parallel equally spaced lines in one direction and a second set of parallel equally spaced lines in an orthogonal direction, and the zone boundaries in the successive field include parallel equally spaced lines located midway between the parallel lines of the first set of lines in the first field.

18. A color television camera system as claimed in claim 17 wherein the boundaries in the successive field include the same parallel equally spaced lines in the second set of lines in the first field.

19. A color television camera system as claimed in claim 11 wherein each zone in each field has one of four effective color transmissivity characteristics, the characteristics alternating in pairs in two orthogonal directions.

20. A color television camera system as claimed in claim 11 wherein the color filter areas each have any one of five effective color transmissivity characteristics, J, K, L, M, N, the characteristics being selected so that

K + L = M + N and K + L + 2J yields a luminance signal.

21. A color television camera system as claimed in claim 20, wherein $$J = \frac{2}{3}G + \frac{1}{3}R$$

$$K = \frac{2}{3}R + \frac{1}{3}B$$

$$L = \frac{2}{3}G + \frac{1}{3}B$$

$$M = \frac{2}{3}B + \frac{1}{3}R$$

$$N = \frac{2}{3}G + \frac{1}{3}R$$

where G is total transmissivity of green light, B is total transmissivity of blue light, and R is total transmissivity of red light.

* * * * *